(12) United States Patent
Rise et al.

(10) Patent No.: US 11,668,758 B2
(45) Date of Patent: Jun. 6, 2023

(54) HIGH IMPEDANCE CELL DETECTION

(71) Applicant: Medtronic, Inc., Minneapolis, MN (US)

(72) Inventors: Gregory Rise, Mound, MN (US); Thomas Wallner, San Marcos, CA (US); Nangavalli Ramasubramanian, San Diego, CA (US); Bernadette Parong, San Diego, CA (US)

(73) Assignee: Medtronic, Inc., Minneapolis, MN (US)

( * ) Notice: Subject to any disclaimer, the term of this patent is extended or adjusted under 35 U.S.C. 154(b) by 69 days.

(21) Appl. No.: 17/246,659

(22) Filed: May 2, 2021

(65) Prior Publication Data
US 2022/0357405 A1 Nov. 10, 2022

(51) Int. Cl.
*G01R 31/00* (2006.01)
*G01R 31/392* (2019.01)
*G01R 31/389* (2019.01)
*H01M 10/42* (2006.01)

(52) U.S. Cl.
CPC ......... *G01R 31/392* (2019.01); *G01R 31/389* (2019.01); *H01M 10/4257* (2013.01); *H01M 2010/4278* (2013.01)

(58) Field of Classification Search
USPC .................................. 324/426, 430, 432–435
See application file for complete search history.

(56) References Cited

U.S. PATENT DOCUMENTS

| 2019/0207398 A1* | 7/2019 | Shih | B60L 53/80 |
| 2021/0247457 A1* | 8/2021 | Ko | H01M 10/425 |

OTHER PUBLICATIONS

Medtronic, "Puritan Bennett 980 Ventilator System Information Guide and Best Practices for More Effective Training", 2017, 84 pages.

\* cited by examiner

*Primary Examiner* — Vincent Q Nguyen
(74) *Attorney, Agent, or Firm* — Mueting Raasch Group

(57) ABSTRACT

A state of health of cell groups of a battery may be determined based on direct current impedance values of the cell groups. A computing apparatus may be configured to determine a direct current internal resistance (DCIR) value of each of the cell groups of the battery pack to provide a plurality of DCIR values. Each cell group may include a plurality of battery cells. The computing apparatus may be configured to determine an average DCIR value based on the plurality of DCIR values and determine a relative DCIR threshold for at least one of the plurality of cell groups based on the average DCIR value. The computing apparatus may further be configured to provide an alert to a user in response to the DCIR value of the at least one of the plurality of cell groups exceeding the relative DCIR threshold.

22 Claims, 6 Drawing Sheets

HIGH IMPEDANCE CELL DETECTION

FIELD

The present disclosure relates to, among other things, rechargeable batteries or battery cells.

TECHNICAL BACKGROUND

Rechargeable batteries may include a plurality of battery cells (e.g., electrochemical cells). The battery cells may be arranged in various configurations of parallel and series connections. Battery cells connected in series increase the voltage of the battery while battery cells connected in parallel increase the energy capacity of the battery. For example, batteries may include a plurality of cell groups arranged in series with one another. In turn, each cell group may include a plurality of battery cells arranged in parallel with one another. Such arrangement of the battery cells may provide a greater voltage than battery cells arranged only in parallel and a greater energy capacity than battery cells arranged only in series. However, typical methods of state of health detection of battery cells may be impractical in such a cell arrangement.

Typical state of health detection of battery cells may include impedance detection or capacity detection. To determine an impedance of a battery cell, a known current may be applied to the battery and a voltage drop over the cell may be determined. To determine capacity of a battery cell, a peak voltage of the battery cell may be determined. However, to determine such voltages of individual battery cells may require that the battery cells are removed from the battery pack and/or host device and tested individually. Removal of individual battery cells from a device (e.g., a medical device) for regular testing may be cumbersome, time consuming, inconvenient, and impractical. Accordingly, methods, apparatus, and systems to determine impedance and/or capacity of battery cells of batteries that include a plurality of cell groups (e.g., battery cells arranged in parallel) arranged in series is desirable.

BRIEF SUMMARY

As described herein, determining a state of health of battery cells of a battery that includes battery cells arranged in parallel and series can be achieved by determining a direct current internal resistance (DCIR) value for each cell group of the battery and comparing such DCIR values to corresponding relative DCIR thresholds and absolute DCIR thresholds. Cell groups may include a plurality of battery cells arranged in parallel and the cell groups may be operatively coupled in series to one another. A DCIR of each of the cell groups may be determined using a computing device. To determine a relative DCIR for a given cell group, an average DCIR may be determined using the DCIR of each other cell group and a tolerance may be added to the average DCIR. To determine the absolute DCIR threshold for the given cell group, a temperature of the given cell group may be determined and an absolute DCIR threshold may be determined based on the temperature. A user may be alerted if the DCIR value of any of the cell groups exceeds either the relative DCIR threshold or the absolute DCIR threshold.

Further, as described herein, determining a state of health of battery cells of a battery that includes battery cells arranged in parallel and series can be achieved by determining a capacity of each cell group of the battery. In one or more embodiments, a voltage of the cell groups at 100 percent state of charge can be a proxy for capacity. The voltages of each of the cell groups may be determined while the battery is at 100 percent state of charge. Relative voltage thresholds may be determined for each of the cell groups. The relative voltage thresholds may be determined by adding a tolerance to one or more average voltages of the cell groups. Additionally, the voltages of each of the cell groups may be compared to one or more absolute voltage thresholds. A user may be alerted if the voltage of any of the cell groups exceeds either the relative voltage threshold or the absolute voltage threshold.

Advantages and additional features of the subject matter of the present disclosure will be set forth in the detailed description which follows, and in part will be readily apparent to those skilled in the art from that description or recognized by practicing the subject matter of the present disclosure as described herein, including the detailed description which follows, the claims, as well as the appended drawings.

It is to be understood that both the foregoing general description and the following detailed description present embodiments of the subject matter of the present disclosure and are intended to provide an overview or framework for understanding the nature and character of the subject matter of the present disclosure as it is claimed. The accompanying drawings are included to provide a further understanding of the subject matter of the present disclosure and are incorporated into and constitute a part of this specification. The drawings illustrate various embodiments of the subject matter of the present disclosure and together with the description serve to explain the principles and operations of the subject matter of the present disclosure. Additionally, the drawings and descriptions are meant to be merely illustrative and are not intended to limit the scope of the claims in any manner.

BRIEF DESCRIPTION OF THE DRAWINGS

The following detailed description of specific embodiments of the present disclosure can be best understood when read in conjunction with the following drawings, in which.

The schematic drawing is not necessarily to scale.

DETAILED DESCRIPTION

Reference will now be made in greater detail to various embodiments of the subject matter of the present disclosure, some embodiments of which are illustrated in the accompanying drawings. Like numbers used in the figures refer to like components and steps. However, it will be understood that the use of a number to refer to a component in a given figure is not intended to limit the component in another figure labeled with the same number. In addition, the use of different numbers to refer to components in different figures is not intended to indicate that the different numbered components cannot be the same or similar to other numbered components.

Figure 1:
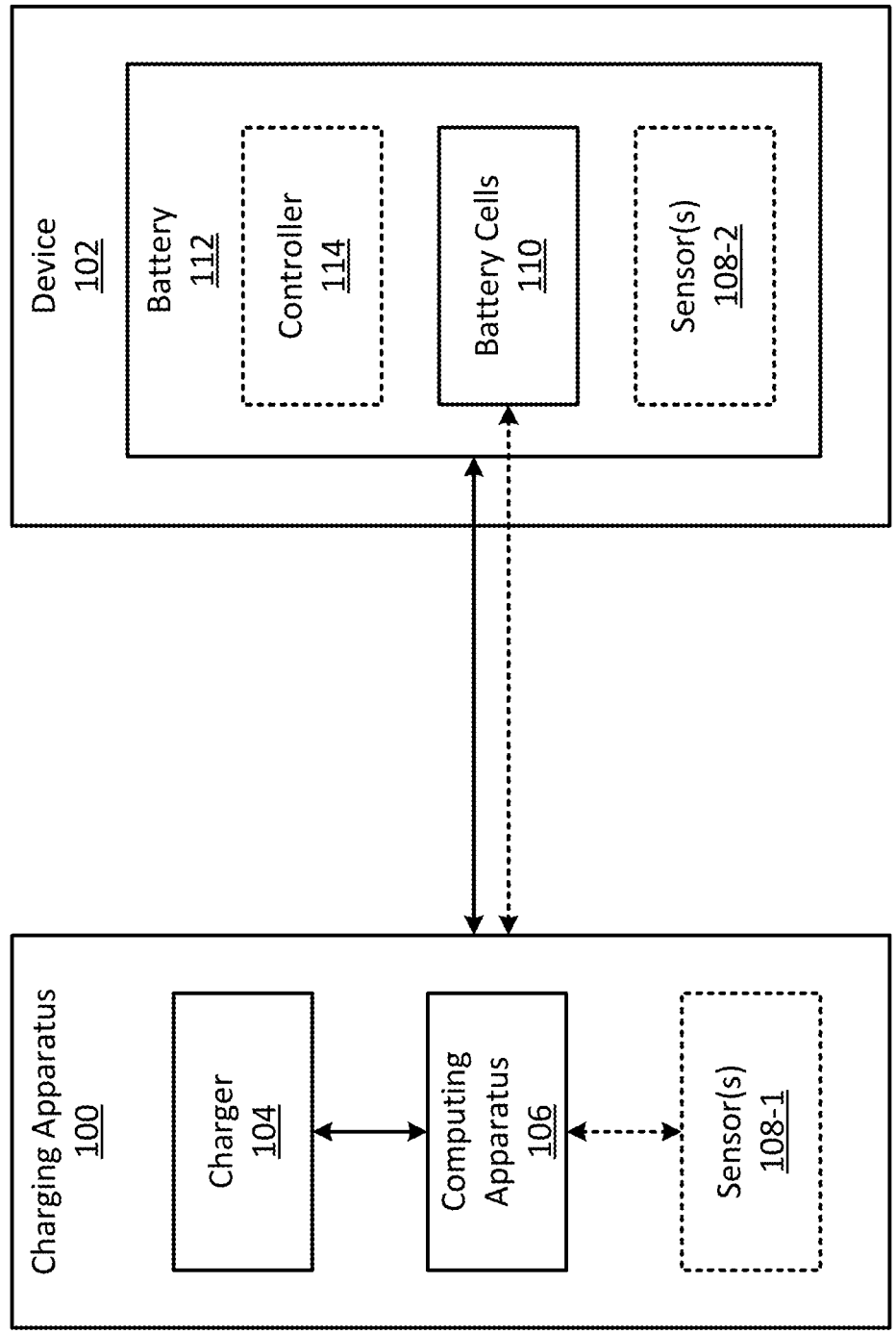
FIG. 1 is a schematic block diagram of an embodiment of a battery charging apparatus and a device.

Referring now to FIG. 1, a schematic block diagram of a charging apparatus 100 and a device 102 is shown.

The charging apparatus 100 includes a charger 104 and a computing apparatus 106. The charging apparatus 100 may optionally include one or more sensors 108-1. The charging apparatus 100 may include a housing (not shown) to house the charger 104 and the computing apparatus 106. The housing may also house the sensors 108-1.

The device 102 includes battery pack 112. The battery pack 112 may be disposed in the device 102. Although only shown with a single battery (e.g., battery pack 112), the device may include multiple batteries. The battery pack 112 may include a plurality of battery cells 110, a controller 114, and one or more sensors 108-2. The device 102 may be a medical device. The medical device may be, for example, an implantable neurostimulator, ventilator, surgical stapler, or medical monitoring equipment.

Figure 2:
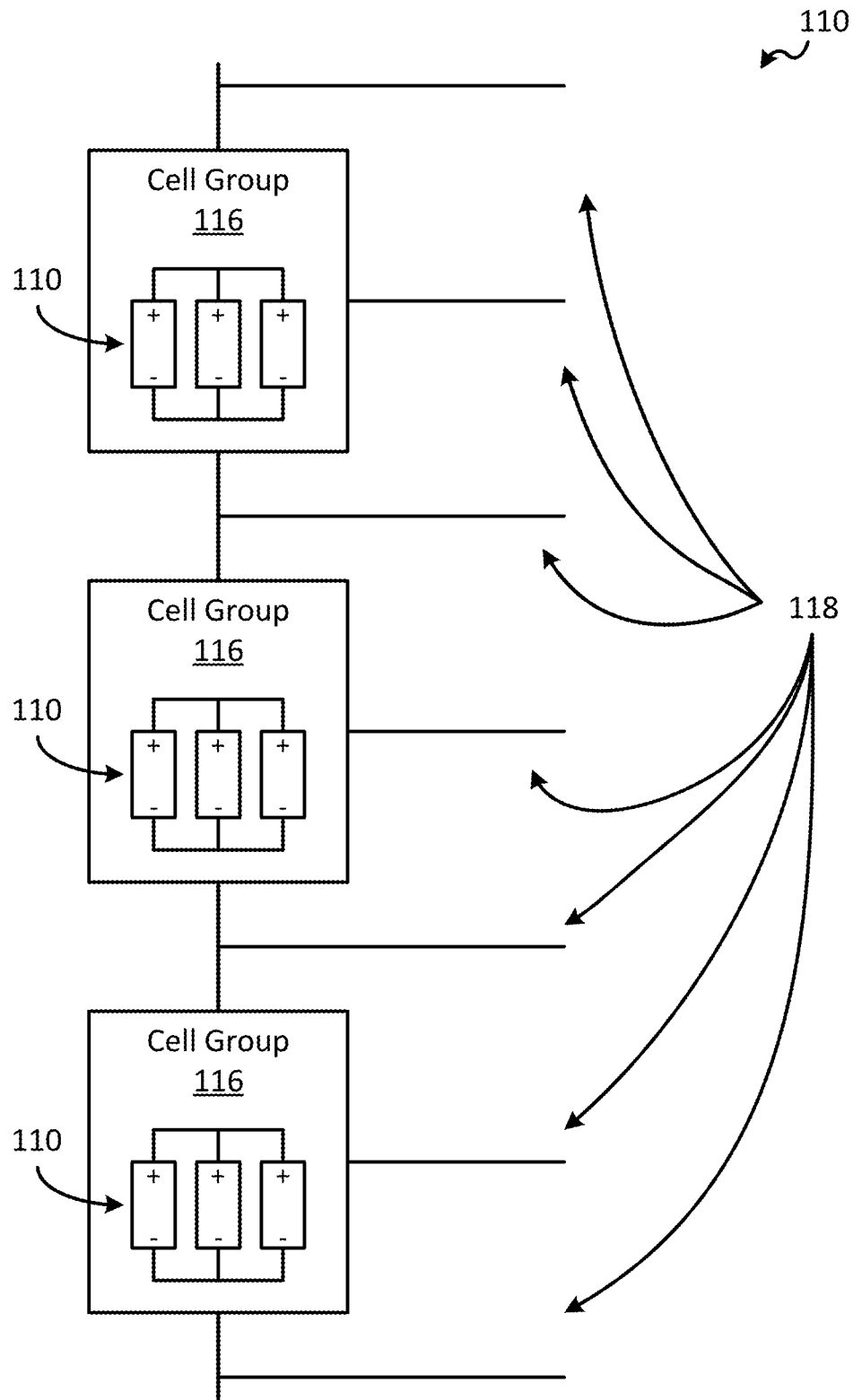
FIG. 2 is a schematic block diagram of an embodiment of cell groups of a battery.

The battery cells 110 may be arranged in cell groups 116 as shown in FIG. 2. Each of the cell groups 116 may include a plurality of battery cells 110 connected to each other in parallel. Although shown with three battery cells 110 connected in parallel, the cell groups 116 may include any suitable number of battery cells connected in parallel. For example, each of the cell groups 116 may include at least 2 battery cells 110 and up to 20 battery cells connected in parallel. The cell groups 116 may be connected to each other in series. Although shown with three cell groups 116, battery packs may include any suitable number of cell groups 116 connected in parallel. For example, battery packs may include at least 2 cell groups 116 and up to 20 cell groups connected in parallel.

A plurality of nodes 118 or connection points may be operatively coupled to the cell groups 116 at various points to allow various parameters of the cell groups 116 to be determined. The nodes 118 may be operatively coupled to the controller 114 and/or the sensors 108-2. The nodes 118 may allow a voltage of each of the cell groups 116 to be determined. One or more of the nodes 118 may be operatively coupled to temperature sensors and the controller 114. The temperature sensors may sense a temperature of one or more of the cell groups 116 and provide a temperature signal to the controller 114. Such parameters may be used by the controller 114 or the computing apparatus 106 to determine a state of health of cell groups 116 the battery pack 112.

The charger 104 may be configured to charge or provide current to the battery pack 112. Although only one battery is shown, the charger 104 may be configured to charge or provide current to multiple batteries. The charger 104 may include any suitable circuitry or electronics to charge the battery pack 112 such as, e.g., a power source, rectifier circuit, power circuit, control circuit, regulator circuit, fault detection circuit, etc.

The computing apparatus 106 may be operatively coupled to the charger 104. The computing apparatus 106 may control the charger 104 to charge the battery pack 112. The computing apparatus 106 may be operatively coupled to the sensors 108-1. The computing apparatus may be configured to monitor various conditions related to charging the battery pack 112 or the battery cells 110 such as, e.g., charging current, voltage, temperature, etc. Additionally, the computing apparatus 106 may be configured to determine a state of health of the cell groups 116 of the battery pack 112 according to the various methods described herein.

The state of health of the cell groups 116 of the battery pack 112 may be determined in any suitable manner. The state of health of the cell groups 116 of the battery pack 112 may be determined directly or indirectly. The state of health of the cell groups 116 may relate to the passage of time since the manufacture of the battery, may reflect deteriorating performance associated with use or charging of the battery, or the like. The determination of the state of health of the battery may be an estimate of battery cell impedance or capacitance based on one or more parameters of cell groups of the battery. For example, the state of health of the cell groups 116 of the battery pack 112 may be determined based on a direct current internal resistance (DCIR) of the cell groups, relative DCIR thresholds, absolute DCIR thresholds, voltages of the cell groups, relative voltage thresholds, and absolute voltage thresholds.

Data regarding the state of health of the cell groups 116 of the battery pack 112 may be stored in the controller 114, obtained by sensor(s) 108-1, 108-2, or the like. Data regarding the state of health of the cell groups 116 of the battery pack 112 may be provided to the computing apparatus 106 so that computing apparatus 106 may determine the state of health of the cell groups 116 of the battery pack 112 based on the data.

In one embodiment, to determine the state of health of the battery the computing apparatus 106 may be configured to determine a DCIR value and a corresponding relative DCIR threshold for each of the cell groups 116. For example, the computing apparatus 106 may be configured to determine a relaxed voltage and a pulsed voltage of each cell group 116. The relaxed voltage may be determined when no current is provided to the battery pack 112. The pulsed voltage may be determined when a known current is provided to the battery pack 112. The computing apparatus 106 may be configured to cause the charger 104 to supply a current pulse to the battery and determine the pulse voltage while the current pulse is supplied. In one embodiment, the current pulse may be a current of 1.25 amps provided for 20-25 seconds. The relaxed and pulse voltages may be obtained by sensor(s) 108-1, 108-2. The computing apparatus 106 may determine the DCIR of each of the cell groups based on the relaxed voltages, the pulsed voltages, and the pulsed current using, for example, Ohm's law, a table of values, etc.

The relative DCIR thresholds may be determined based on average DCIR values of the cell groups. Each of the average DCIR values may be a subset of the DCIR values. The subset of DCIR values includes at least one less DCIR value than the total number of DCIR values. To determine the relative DCIR threshold for a cell group of the cell groups 116, an average DCIR of all other cell groups may be determined. In other words, if the battery pack 112 includes seven cell groups labeled t1-t7, the relative DCIR threshold for cell group t1 may be determined based on an average of the DCIR values for t2-t7. The relative DCIR thresholds may further be determined by adding a tolerance to each of the average DCIR values. The tolerance may be a percentage of the average or a predetermined impedance value. For example, each tolerance may be at least 10 percent of the corresponding average DCIR value, at least 15 percent of the corresponding average DCIR value, at least 20 percent of the corresponding average DCIR value, at least 25 percent of the corresponding average DCIR value, at least 30 percent of the corresponding average DCIR value, or any percent between 10 percent and 30 percent of the corresponding average DCIR value. In another example, the tolerance may be at least 5 ohms, at least 10 ohms, at least 15 ohms, or any number of ohms between 5 ohms and 15 ohms.

In one embodiment, to determine the state of health of the battery the computing apparatus 106 may be configured to determine an absolute DCIR threshold for each cell group. To determine an absolute DCIR value for each cell group, the computing apparatus 106 may be configured to determine a temperature of each of the cell groups 116. The temperature of each of the cell groups 116 may be determined using temperature sensors (e.g., sensors 108-1). The absolute DCIR threshold for each cell group may be determined based on a temperature range that the temperature of each cell group falls into. For example, three temperature ranges may be defined such that each temperature range is associated with a different resistance or impedance. Such temperature ranges may include, for example, a first temperature range less than 20 degrees Celsius (° C.), a second temperature range 20-35° C., and a third range greater than 35° C. In one embodiment, the first temperature range may indicate an absolute DCIR threshold of, e.g., 70 milliohms, the second temperature range may indicate an absolute DCIR threshold of, e.g., 50 milliohms, the third temperature range may indicate an absolute DCIR threshold of 47 milliohms. The predetermined impedance values associated with the temperature ranges may be determined based on, for example, battery cell type, initial DCIR values (e.g., DCIR values of new cells), battery cell data sheets, nominal impedance values, experimental impedance values, etc.

In another embodiment, to determine the state of health of the cell groups the computing apparatus 106 may be configured to determine a voltage level and a relative voltage threshold for each of the cell groups 116 when the battery is at 100 percent state of charge. When the battery pack 112 is at 100 percent state of charge, the voltage levels of the cell groups 116 may be used as a proxy for capacity. The voltage may be determined by using voltage sensors (e.g., sensors 108-1) or by sampling a voltage at a positive and negative node of each of the cell groups.

The computing apparatus 106 may be configured to determine the relative voltage thresholds based on averages of the voltage levels. Each of the average voltage levels may be determined based on a subset of the voltage levels of the cell groups 116. A subset may refer to a portion of a set (e.g., the voltage levels) but does not include the complete set. For example, if a battery has seven cell groups (t1-t7) an average voltage level corresponding to cell group t1 may be an average of the voltage level of the cell groups t2-t7. Each of the relative voltage thresholds may be determined by subtracting a tolerance from an average voltage level corresponding to one of the cell groups 116. The tolerance may be a percentage of the corresponding average voltage level or a predetermined number. For example, the tolerance may be at least 10 percent of the corresponding average voltage level, at least 15 percent of the corresponding average voltage level, at least 20 percent of the corresponding average voltage level, at least 25 percent of the corresponding average voltage level, at least 30 percent of the corresponding average voltage level, or any percent between 10 percent and 30 percent of the voltage level. In another example, the tolerance may be at least 300 millivolts, at least 400 millivolts, at least 500 millivolts, or any number of millivolts between 300 millivolts and 500 millivolts.

In another embodiment, to determine the state of health of the cell groups the computing apparatus 106 may be configured to determine an absolute voltage threshold for each of the cell groups 116. The absolute voltage thresholds may be a set of predetermined voltages. The predetermined voltages may be based on a type of the battery cells of the battery pack 112. For example, if the battery cells are lithium-ion batteries the predetermined voltages may be 3.6 volts. The predetermined voltages may be based on an initial voltage of the battery cells (e.g., the voltage at 100 percent state of charge when new), a battery cell data sheet, etc.

The computing apparatus 106 may be configured to provide an alert to a user in response to the voltage level of one of the plurality of cell groups 116 being lower than an the relative threshold voltage or the absolute voltage threshold. The alert may be provided to the user via a user interface, an LED, an audio alert, etc. The alert may indicate which of the cell groups is below one of the voltage thresholds.

The battery pack 112 may include the controller 114 to monitor the battery cells 110, maintain safe operating conditions of the battery cells, report various conditions of the battery cells. The controller 114 may be a battery management system. The controller 114 may use or include one or more processors such as, e.g., one or more microprocessors, DSPs, ASICs, FPGAs, CPLDs, microcontrollers, or any other equivalent integrated or discrete logic circuitry, as well as any combinations of such components, image processing devices, or other devices. Additionally, the controller 114 may be configured to determine an state of health of the battery cells 110 of the battery pack 112 according to the various methods described herein. That is, the controller 114 may comprise computing apparatus (not shown) to carry out one or more aspects described herein regarding computing apparatus 106.

The battery pack 112 may further include sensors 108-2 to sense temperature, voltage, current, etc. The sensors 108-1, 108-2 (referred to collectively as sensors 108) may include any suitable sensor or sensors such as, e.g., temperature sensors, current sensors, voltage sensors, state of charge sensors, etc. The sensors 108 may provide a sensed temperature signal, sensed current signal, sensed voltage signal, sensed state of charge signal, etc. The signals provided by the sensors 108 may be indicative of the properties sensed by the sensors.

Figure 3:
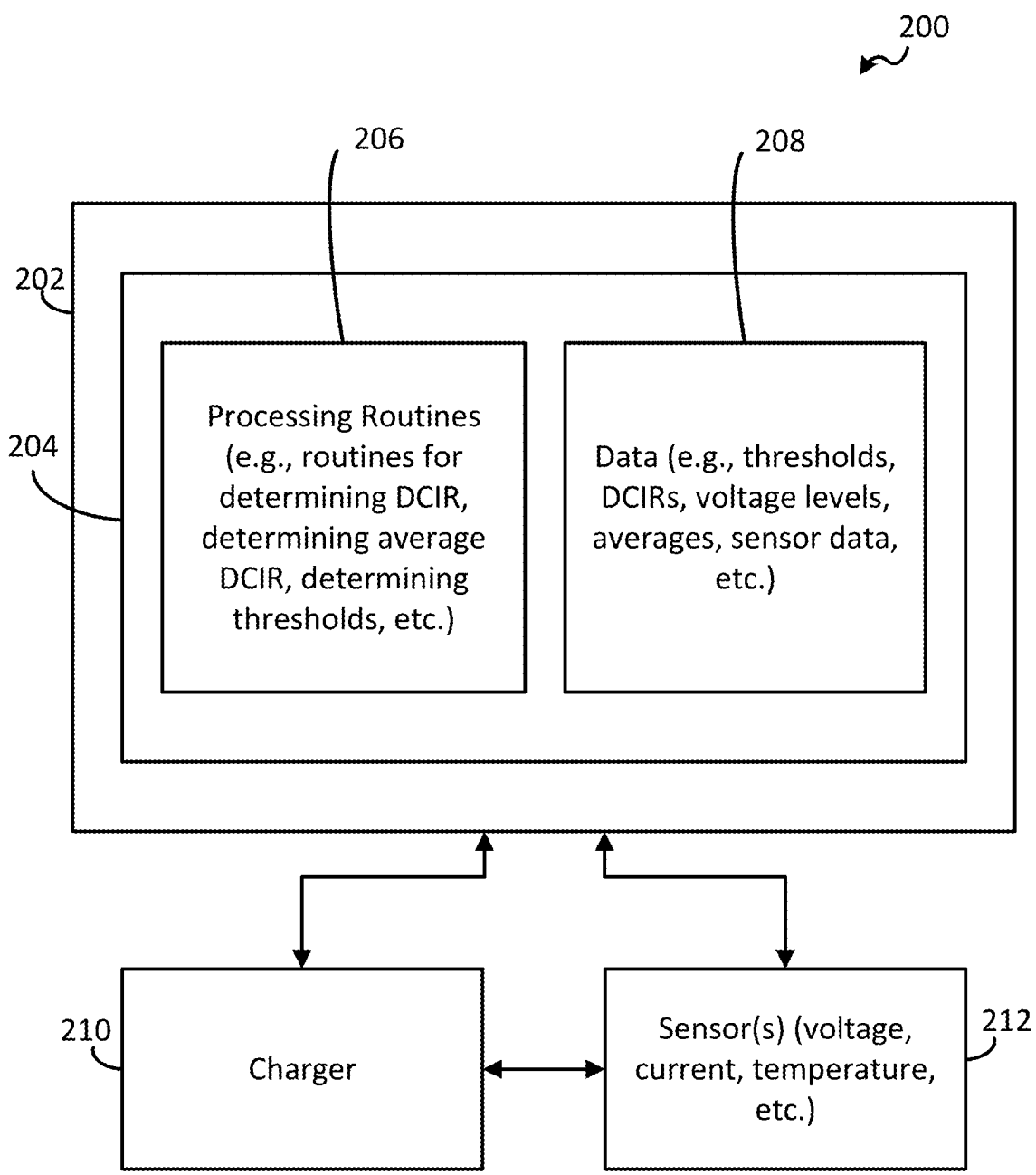
FIG. 3 is a schematic block diagram of an embodiment of a battery charging apparatus.

Referring now to FIG. 3, a schematic block diagram of a charging apparatus 200 (e.g., charging apparatus 100 of FIG. 1) according to embodiments described herein is shown. The charging apparatus 200 may include a computing apparatus or processor 202 and a charger 210. Generally, the charger 210 may be operably coupled to the computing apparatus 202 and may include any suitable circuits or devices configured charge batteries or battery cells. For example, the charger 210 may include one or more power sources, rectifier circuits, power circuits, control circuits, regulator circuits, fault detection circuits, etc.

The charging apparatus 200 may additionally include one or more sensors 212 operably coupled to the computing apparatus 202. Generally, the sensors 212 may include any one or more devices configured to sense charging information of the charger 210 or battery cells. The sensors 212 may include any apparatus, structure, or device to capture the charging information of the charger such as one or more current sensors, voltage sensors, temperature sensors, etc.

Further, the computing apparatus 202 includes data storage 204. Data storage 204 allows for access to processing programs or routines 206 and one or more other types of data 208 that may be employed to carry out the techniques, processes, and algorithms of determining a state of health of a battery, cell groups, or battery cells. For example, processing programs or routines 206 may include programs or routines for, determining a relaxed voltage, determining a charge pulse voltage, charging a battery, determining DCIRs of cell groups, determining thresholds, providing a current pulse, computational mathematics, matrix mathematics, Fourier transforms, compression algorithms, calibration algorithms, image construction algorithms, inversion algorithms, signal processing algorithms, normalizing algorithms, deconvolution algorithms, averaging algorithms, standardization algorithms, comparison algorithms, vector mathematics, or any other processing required to implement one or more embodiments as described herein.

Data 208 may include, for example, DCIRs, averages, voltage levels, temperature data, voltage data, charging current data, state of health data, state of charge data, thresholds, arrays, meshes, grids, variables, counters, statistical estimations of accuracy of results, results from one or more processing programs or routines employed according to the disclosure herein (e.g., determining an age of a battery, determining a charging voltage of a battery, etc.), or any other data that may be necessary for carrying out the one or more processes or techniques described herein.

In one or more embodiments, the charging apparatus 200 may be controlled using one or more computer programs executed on programmable computers, such as computers that include, for example, processing capabilities (e.g., microcontrollers, programmable logic devices, etc.), data storage (e.g., volatile or non-volatile memory and/or storage elements), input devices, and output devices. Program code and/or logic described herein may be applied to input data to perform functionality described herein and generate desired output information. The output information may be applied as input to one or more other devices and/or processes as described herein or as would be applied in a known fashion.

The programs used to implement the processes described herein may be provided using any programmable language, e.g., a high-level procedural and/or object orientated programming language that is suitable for communicating with a computer system. Any such programs may, for example, be stored on any suitable device, e.g., a storage media, readable by a general or special purpose program, computer or a processor apparatus for configuring and operating the computer when the suitable device is read for performing the procedures described herein. In other words, at least in one embodiment, the charging apparatus 200 may be controlled using a computer readable storage medium, configured with a computer program, where the storage medium so configured causes the computer to operate in a specific and predefined manner to perform functions described herein.

The computing apparatus 202 may be, for example, any fixed or mobile computer system (e.g., a personal computer or minicomputer). The exact configuration of the computing apparatus is not limiting and essentially any device capable of providing suitable computing capabilities and control capabilities (e.g., control the current output of the charging apparatus 200, the acquisition of data such as sensor data) may be used. Additionally, the computing apparatus 202 may be incorporated in a housing of the charging apparatus 200. Further, various peripheral devices, such as a computer display, mouse, keyboard, memory, printer, scanner, etc. are contemplated to be used in combination with the computing apparatus 202. Further, in one or more embodiments, the data 208 (e.g., DCIRs, currents, voltages, thresholds, averages, an array, a mesh, a digital file, etc.) may be analyzed by a user, used by another machine that provides output based thereon, etc. As described herein, a digital file may be any medium (e.g., volatile or non-volatile memory, a CD-ROM, a punch card, magnetic recordable tape, etc.) containing digital bits (e.g., encoded in binary, trinary, etc.) that may be readable and/or writeable by computing apparatus 202 described herein. Also, as described herein, a file in user-readable format may be any representation of data (e.g., ASCII text, binary numbers, hexadecimal numbers, decimal numbers, audio, graphical) presentable on any medium (e.g., paper, a display, sound waves, etc.) readable and/or understandable by a user.

In view of the above, it will be readily apparent that the functionality as described in one or more embodiments according to the present disclosure may be implemented in any manner as would be known to one skilled in the art. As such, the computer language, the computer system, or any other software/hardware that is to be used to implement the processes described herein shall not be limiting on the scope of the systems, processes or programs (e.g., the functionality provided by such systems, processes or programs) described herein.

The techniques described in this disclosure, including those attributed to the systems, or various constituent components, may be implemented, at least in part, in hardware, software, firmware, or any combination thereof. For example, various aspects of the techniques may be implemented by the computing apparatus 202, which may use one or more processors such as, e.g., one or more microprocessors, DSPs, ASICs, FPGAs, CPLDs, microcontrollers, or any other equivalent integrated or discrete logic circuitry, as well as any combinations of such components, image processing devices, or other devices. The term "processing apparatus," "processor," or "processing circuitry" may generally refer to any of the foregoing logic circuitry, alone or in combination with other logic circuitry, or any other equivalent circuitry. Additionally, the use of the word "processor" may not be limited to the use of a single processor but is intended to connote that at least one processor may be used to perform the techniques and processes described herein.

Such hardware, software, and/or firmware may be implemented within the same device or within separate devices to support the various operations and functions described in this disclosure. In addition, any of the described components may be implemented together or separately as discrete but interoperable logic devices. Depiction of different features, e.g., using block diagrams, etc., is intended to highlight different functional aspects and does not necessarily imply that such features must be realized by separate hardware or software components. Rather, functionality may be performed by separate hardware or software components or integrated within common or separate hardware or software components.

When implemented in software, the functionality ascribed to the systems, devices and techniques described in this disclosure may be embodied as instructions on a computer-readable medium such as RAM, ROM, NVRAM, EEPROM, FLASH memory, magnetic data storage media, optical data storage media, or the like. The instructions may be executed by the computing apparatus 202 to support one or more aspects of the functionality described in this disclosure.

Figure 4:
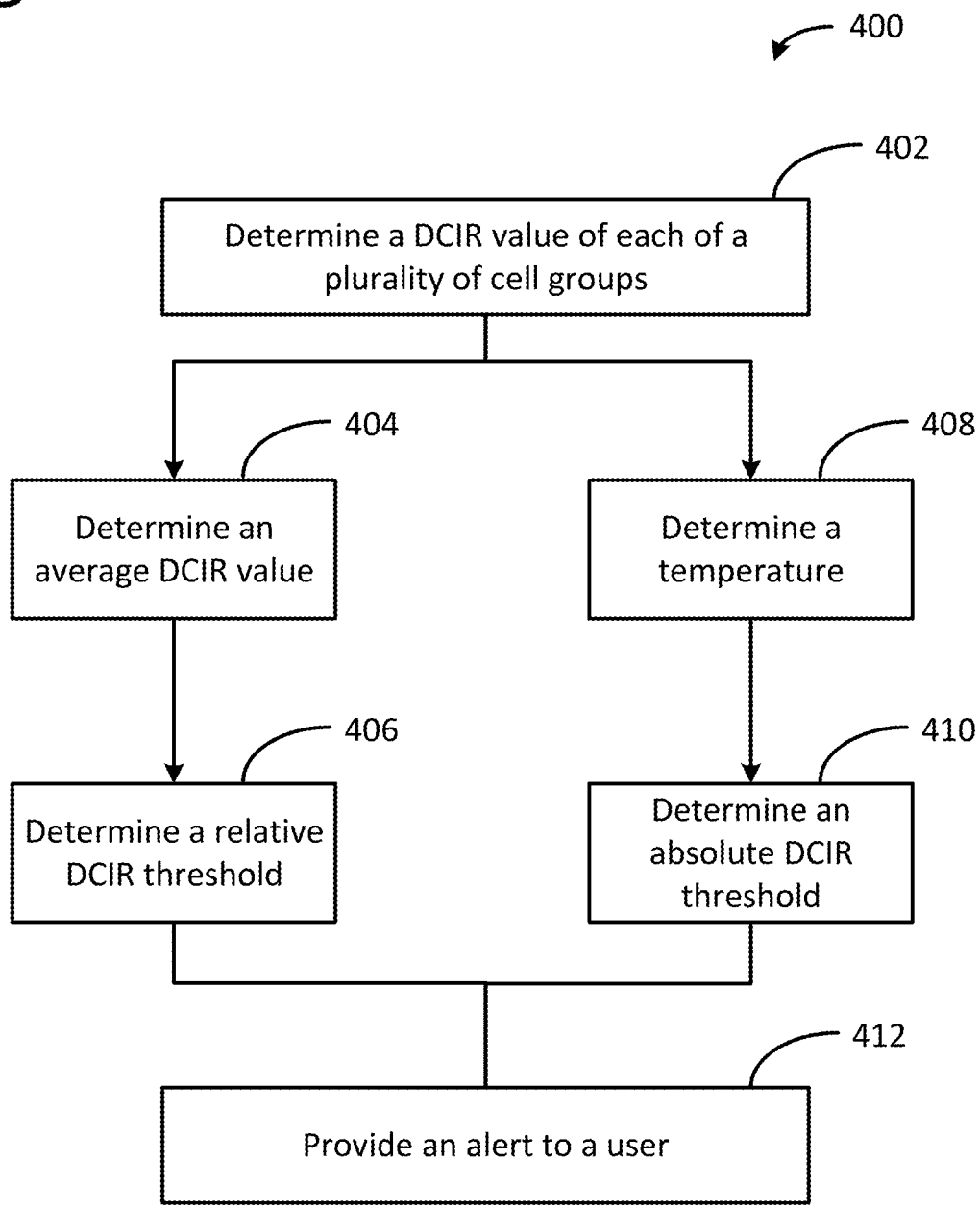
FIG. 4 is a flow diagram of an embodiment of a process for detecting cell groups with increased internal impedance.

Referring now to FIG. 4, a flow diagram of an embodiment of a process 400 for determining a state of health of a cell groups (e.g., cell groups 116 of FIG. 2) is shown. Although the process 400 is described with respect to battery pack 112 of FIG. 1 and cell groups 116 of FIG. 2 and charging apparatus 100 and 200 of FIGS. 1 and 3, the process 400 may be used with any suitable battery or charging apparatus.

Figure 5:
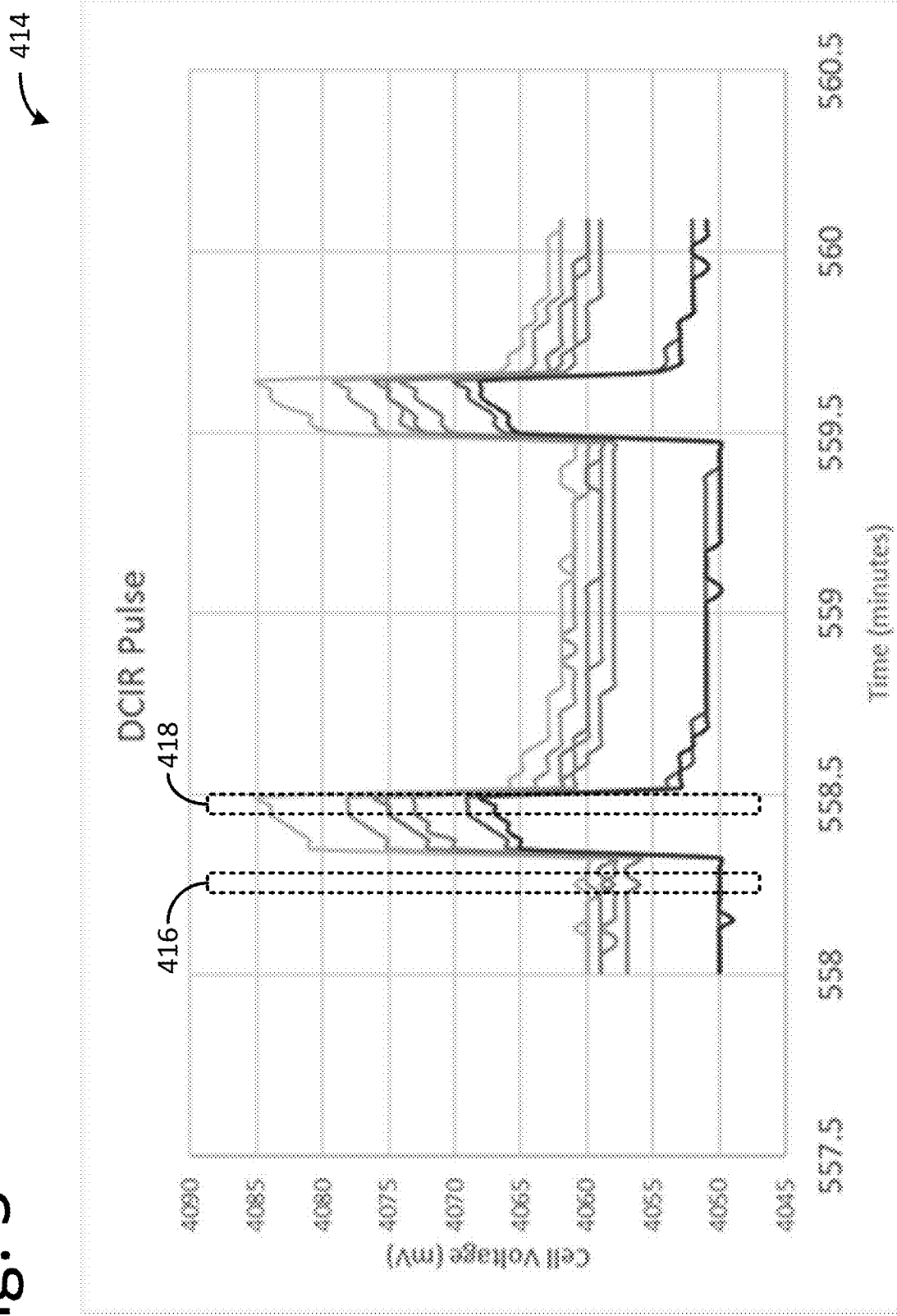
FIG. 5 is a graph of cell group voltages obtained during a current pulse.

At 402, a direct current internal resistance (DCIR) value of each of a plurality of cell groups (e.g., cell groups 116 of FIG. 2) is determined. To determine the DCIR value of each cell group, a relaxed voltage and a pulsed voltage of each cell group may be determined. FIG. 5 depicts a graph 414 of the voltage obtained from a plurality of cell groups over time including a relaxed state during window 416 and during a current pulse in window 418. A relaxed voltage may refer to a voltage of each cell group or battery cell when no current is provided to the battery, e.g., during window 416. A pulsed voltage may refer to a voltage when a known current is supplied to the battery, e.g., during window 418. In other words, a pulsed voltage may be determined when a known current is provided to the battery. The DCIR value of each of the plurality of cell groups may be based on the relaxed voltages (V1), the pulsed voltages (V2), and the current pulse (Ip). A voltage difference between the relaxed voltage and the pulse voltage of each cell group may be determined. Ohm's law may be used to determine the DCIR of each cell group by inputting the voltage difference of each cell group and the pulsed current. In other words, the DCIR value may be determined using Equation 1:

$$DCIR = (V2 - V1)/Ip \quad \text{(Equation 1)}$$

In one embodiment, determining the DCIR value for each node may further include an offset for each cell group. The offset for each cell group may be determined based on resistive elements of the physical connections of the cell groups. The offset for each cell group may be determined by measuring the impedance of the resistive elements of the physical connections or determining a DCIR of each battery cell or cell group without such physical connections. A DCIR that accounts for resistive elements of physical connections may be determined using Equation 2:

$$DCIR = (V2 - \text{Offset} - V1)/Ip \quad \text{(Equation 2)}$$

At 404 of FIG. 4, an average DCIR value may be determined based on the plurality of DCIR values. At 406, a relative DCIR threshold for at least one of the plurality of cell groups may be determined based on the average DCIR value. The average DCIR value may be determined based on a subset of the plurality of DCIR values. A subset may refer to a portion of a set (e.g., the DCIR values) but does not include the complete set. For example, if a battery has seven cell groups (t1-t7) the average DCIR value may be an average of the DCIR value of the cell groups t2-t7. The relative DCIR threshold may be determined by adding a tolerance to the average DCIR value. The tolerance may be a percentage of the average DCIR value or a predetermined number. For example, each tolerance may be at least 10 percent of the average DCIR value, at least 15 percent of the average DCIR value, at least 20 percent of the average DCIR value, at least 25 percent of the average DCIR value, at least 30 percent of the average DCIR value, or any percent between 10 percent and 30 percent of the DCIR value. In another example, the tolerance may be at least 5 milliohms, at least 10 milliohms, at least 15 milliohms, or any number of milliohms between 5 milliohms and 15 milliohms.

In one embodiment, an average DCIR value and relative DCIR threshold may be determined for each cell group. For example, if the battery pack 112 has seven cell groups 116 (t1-t7), seven average DCIR values and seven DCIR thresholds may be determined. The average DCIR value for a given cell group may be the average of the DCIR values of all other cell groups of the battery pack 112. In other words, the average DCIR value for each of the seven cell groups may be given by equations 3-9:

$$\text{Ave\_DCIR}(t1) = \frac{DCIR(t2) + DCIR(t3) + DCIR(t4) + DCIR(t5) + DCIR(t6) + DCIR(t7)}{6} \quad \text{(Equation 3)}$$

$$\text{Ave\_DCIR}(t2) = \frac{DCIR(t1) + DCIR(t3) + DCIR(t4) + DCIR(t5) + DCIR(t6) + DCIR(t7)}{6} \quad \text{(Equation 4)}$$

$$\text{Ave\_DCIR}(t3) = \frac{DCIR(t1) + DCIR(t2) + DCIR(t4) + DCIR(t5) + DCIR(t6) + DCIR(t7)}{6} \quad \text{(Equation 5)}$$

$$\text{Ave\_DCIR}(t4) = \frac{DCIR(t1) + DCIR(t2) + DCIR(t3) + DCIR(t5) + DCIR(t6) + DCIR(t7)}{6} \quad \text{(Equation 6)}$$

$$\text{Ave\_DCIR}(t5) = \frac{DCIR(t1) + DCIR(t2) + DCIR(t3) + DCIR(t4) + DCIR(t6) + DCIR(t7)}{6} \quad \text{(Equation 7)}$$

$$\text{Ave\_DCIR}(t6) = \frac{DCIR(t1) + DCIR(t2) + DCIR(t3) + DCIR(t4) + DCIR(t5) + DCIR(t7)}{6} \quad \text{(Equation 8)}$$

$$\text{Ave\_DCIR}(t7) = \frac{DCIR(t1) + DCIR(t2) + DCIR(t3) + DCIR(t4) + DCIR(t5) + DCIR(t6)}{6} \quad \text{(Equation 9)}$$

Although equations 3-9 are shown for a battery with seven cell groups it will be appreciated that the equations can be adjusted to suit any number of cell groups.

The relative DCIR threshold for each cell group 116 may be determined based on the corresponding average DCIR value. To determine the relative DCIR thresholds, tolerances may be added to each of the average DCIR values. Each tolerance may be a percentage of the corresponding average DCIR value or a predetermined number. For example, each tolerance may be at least 10 percent of the average DCIR value, at least 15 percent of the average DCIR value, at least 20 percent of the average DCIR value, at least 25 percent of the average DCIR value, at least 30 percent of the average DCIR value, or any percent between 10 percent and 30 percent of the DCIR value. In another example, the tolerance may be at least 5 milliohms, at least 10 milliohms, at least 15 milliohms, or any number of milliohms between 5 milliohms and 15 milliohms.

At 408, a temperature of at least one of the cell groups 116 may be determined, and at 410, an absolute DCIR threshold is determined for the at least one of the plurality of cell groups 116 based on the temperature. The temperature of the at least one of the cell groups 116 may be determined using a temperature sensor (e.g., sensors 108). The DCIR threshold may be determined based on a temperature range that the temperature of the cell group falls into. For example, three temperature ranges may be defined such that each temperature range is associated with a different resistance. Such temperature ranges may include, a first temperature range less than 20° C., a second temperature range 20-35° C., and a third range greater than 35° C.

In one embodiment, the temperature of each cell group 116 may be determined and an absolute DCIR threshold may be determined for each cell group. The absolute DCIR threshold may be determined by the same temperature ranges described above for the at least one of the cell groups 116. For example, each temperature range may be associated with a predetermined impedance. In one embodiment, the first temperature range may indicate an absolute DCIR threshold of, e.g., 70 milliohms, the second temperature range may indicate an absolute DCIR threshold of, e.g., 50 milliohms, the third temperature range may indicate an absolute DCIR threshold of 47 milliohms. The predetermined impedance values associated with the temperature ranges may be determined based on, for example, battery cell type, initial DCIR values (e.g., DCIR values of new cells), battery cell data sheets, nominal impedance values, experimental impedance values, etc.

At 412, an alert may be provided to a user in response to the DCIR value of the at least one of the plurality of cell groups exceeding the relative DCIR threshold or the absolute DCIR threshold. The alert may be provided to the user via a user interface, an LED, an audio alert, etc. The alert may indicate which of the cell groups exceeded one of the DCIR thresholds.

Figure 6:
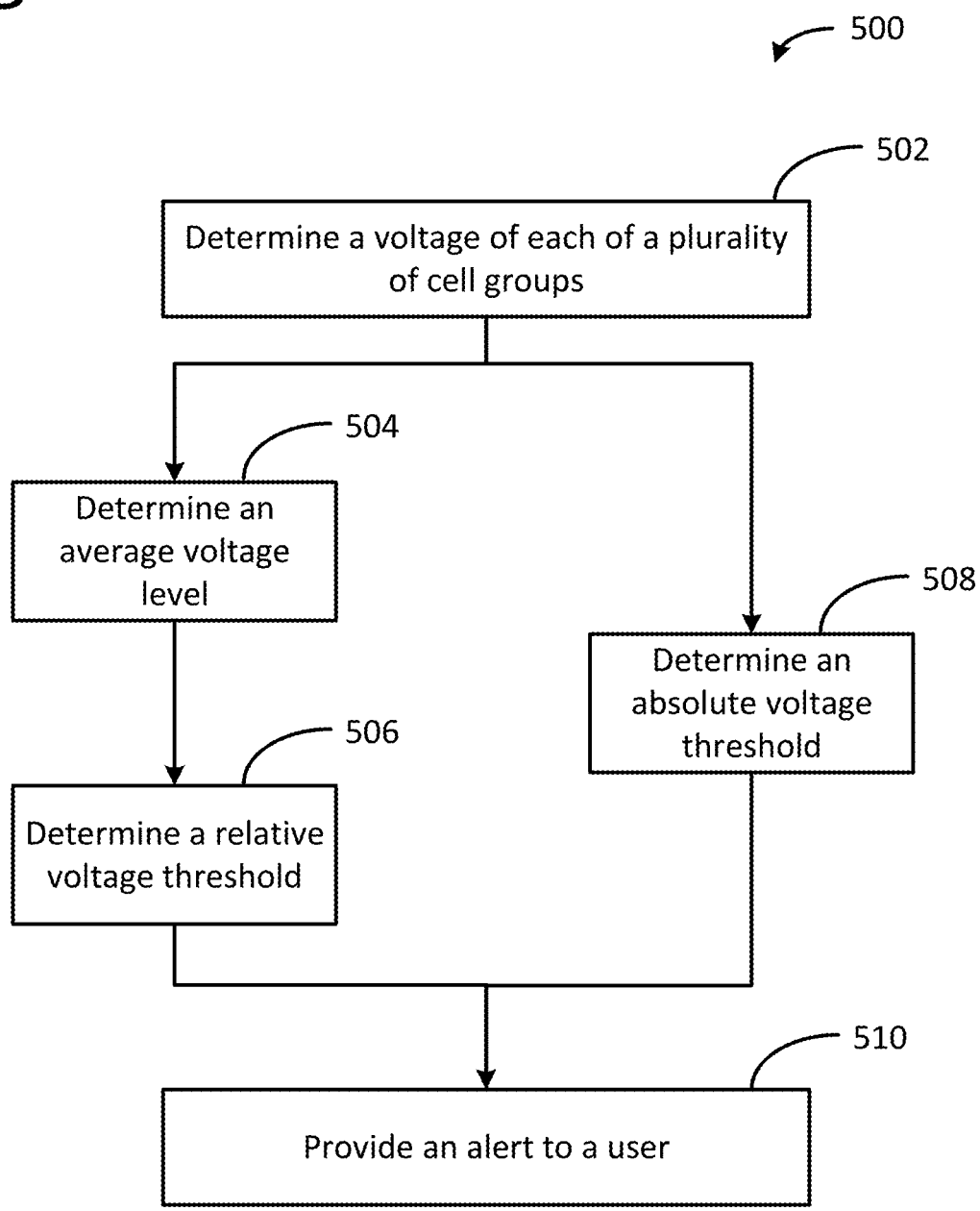
FIG. 6 is a flow diagram of an embodiment of a process for detecting cell groups with diminished capacity.

Referring now to FIG. 6, a flow diagram of an embodiment of a process 500 for determining a state of health of cell groups (e.g., cell groups 116 of FIG. 2) using voltage as a proxy for battery cell capacity is shown. Although the process 500 is described with respect to battery pack 112 of FIG. 1 and cell groups 116 of FIG. 2 and charging apparatus 100 and 200 of FIGS. 1 and 3, the process 400 may be used with any suitable battery or charging apparatus.

At 502, a voltage of each of the plurality of cell groups 116 may be determined when the battery pack 112 is at 100 percent state of charge. By determining the voltage when the battery pack 112 is at 100 percent state of charge, voltage may be used as a proxy for battery cell capacity. The voltage may be determined by using voltage sensors (e.g., sensors 108 of FIG. 1) or using a controller or computing apparatus to sample a voltage at a positive and negative node of each of the cell groups.

At 504, an average voltage level may be determined based on the plurality of voltage levels. At 506, a relative voltage threshold for at least one of the plurality of cell groups 116 may be determined based on the average voltage level. The average voltage level may be determined based on a subset of the plurality of voltage levels. A subset may refer to a portion of a set (e.g., the voltage levels) but does not include the complete set. For example, if a battery has seven cell groups (t1-t7) the average voltage level may be an average of the voltage level of the cell groups t2-t7. The relative voltage threshold may be determined by subtracting a tolerance from the average voltage level. The tolerance may be a percentage of the average voltage level or a predetermined number. For example, each tolerance may be at least 10 percent of the average voltage level, at least 15 percent of the average voltage level, at least 20 percent of the average voltage level, at least 25 percent of the average voltage level, at least 30 percent of the average voltage level, or any percent between 10 percent and 30 percent of the voltage level. In another example, the tolerance may be at least 300 millivolts, at least 400 millivolts, at least 500 millivolts, or any number of millivolts between 300 millivolts and 500 millivolts.

In one embodiment, an average voltage level and relative voltage threshold may be determined for each cell group. For example, if the battery pack 112 has seven cell groups 116 (t1-t7), seven average voltage levels and seven voltage thresholds may be determined. The average voltage level for a given cell group may be the average of the voltage levels of all other cell groups of the battery pack 112. In other words, the average voltage level for each of the seven cell groups may be given by equations 10-16:

$$Ave\_V(t1) = \frac{V(t2) + V(t3) + V(t4) + V(t5) + V(t6) + V(t7)}{6} \quad \text{(Equation 10)}$$

$$Ave\_V(t2) = \frac{V(t1) + V(t3) + V(t4) + V(t5) + V(t6) + V(t7)}{6} \quad \text{(Equation 11)}$$

$$Ave\_V(t3) = \frac{V(t1) + V(t2) + V(t4) + V(t5) + V(t6) + V(t7)}{6} \quad \text{(Equation 12)}$$

$$Ave\_V(t4) = \frac{V(t1) + V(t2) + V(t3) + V(t5) + V(t6) + V(t7)}{6} \quad \text{(Equation 13)}$$

$$Ave\_V(t5) = \frac{V(t1) + V(t2) + V(t3) + V(t4) + V(t6) + V(t7)}{6} \quad \text{(Equation 14)}$$

$$Ave\_V(t6) = \frac{V(t1) + V(t2) + V(t3) + V(t4) + V(t5) + V(t7)}{6} \quad \text{(Equation 15)}$$

$$Ave\_V(t7) = \frac{V(t1) + V(t2) + V(t3) + V(t4) + V(t5) + V(t6)}{6} \quad \text{(Equation 16)}$$

Although equations 10-16 are shown for a battery with seven cell groups it will be appreciated that the equations can be adjusted to suit any number of cell groups.

The relative voltage threshold for each cell group 116 may be determined based on the corresponding average voltage level. To determine the relative voltage thresholds, tolerances may be subtracted from each of the average voltage levels. Each tolerance may be a percentage of the corresponding average voltage level or a predetermined number. For example, each tolerance may be at least 10 percent of the average voltage level, at least 15 percent of the average voltage level, at least 20 percent of the average voltage level, at least 25 percent of the average voltage level, at least 30 percent of the average voltage level, or any percent between 10 percent and 30 percent of the voltage level. In another example, the tolerance may be at least 300 millivolts, at least 400 millivolts, at least 500 millivolts, or any number of millivolts between 300 millivolts and 500 millivolts.

At 508, an absolute voltage threshold may be determined. The absolute voltage threshold may be a predetermined voltage. The predetermined voltage may be based on a type of the battery cells of the battery pack 112. For example, if the battery cells are lithium-ion batteries the predetermined voltage may be 3.6 volts. The predetermined voltages may be based on an initial voltage of the battery cells (e.g., the voltage at 100 percent state of charge when new), a battery cell data sheet, etc.

At 510, an alert may be provided to the user in response to the voltage level of one of the plurality of cell groups 116 being lower than an the relative threshold voltage or the absolute voltage threshold. The alert may be provided to the user via a user interface, an LED, an audio alert, etc. The alert may indicate which of the cell groups is below one of the voltage thresholds.

All scientific and technical terms used herein have meanings commonly used in the art unless otherwise specified. The definitions provided herein are to facilitate understanding of certain terms used frequently herein and are not meant to limit the scope of the present disclosure.

As used herein, singular forms "a," "an" and "the" include plural referents unless the context clearly dictates otherwise. As used in this specification and the appended claims, the term "or" is generally employed in its sense including "and/or" unless the content clearly dictates otherwise. The term "and/or" means one or all of the listed elements or a combination of any two or more of the listed elements.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the inventive technology.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be apparent to those skilled in the art that various modifications and variations can be made to the present inventive technology without departing from the spirit and scope of the disclosure. Since modifications, combinations, sub-combinations and variations of the disclosed embodiments incorporating the spirit and substance of the inventive technology may occur to persons skilled in the art, the inventive technology should be construed to include everything within the scope of the appended claims and their equivalents.

What is claimed is:

1. An apparatus comprising:
   a charger configured to charge a battery pack; and
   a computing apparatus comprising one or more processors and operatively coupled to the charger, the computing apparatus configured to:
   determine a relaxed voltage of each of a plurality of cell groups of the battery pack, wherein each cell group comprises a plurality of battery cells;
   cause the charger to provide a current pulse to the battery pack;
   determine a pulsed voltage of each of the plurality of cell groups during the current pulse; and
   determine a direct current internal resistance (DCIR) value of each of the plurality of cell groups based on the relaxed voltages, the pulsed voltages, and the current pulse;
   determine an average DCIR value based on the plurality of DCIR values;
   determine a relative DCIR threshold for at least one of the plurality of cell groups based on the average DCIR value; and
   provide an alert to a user in response to the DCIR value of the at least one of the plurality of cell groups exceeding the relative DCIR threshold.

2. The apparatus as in claim 1, wherein the computing apparatus is further configured to:
   determine a plurality of average DCIR values based on the plurality of DCIR values; and
   determine a relative DCIR threshold for each of the plurality of cell groups based on the plurality of DCIR values.

3. The apparatus as in claim 1, wherein each of the average DCIR values is an average of a subset of the DCIR values, wherein the subset of DCIR values includes at least one less DCIR value than a number of the plurality of DCIR values.

4. The apparatus as in claim 1, wherein determining the relative DCIR threshold comprises adding a tolerance to the average DCIR value.

5. The apparatus as in claim 4, wherein the tolerance is a percentage of the average DCIR value.

6. The apparatus as in claim 4, wherein the tolerance is a predetermined number.

7. The apparatus as in claim 1, wherein the computing apparatus is further configured to:
   determine a temperature of at least one of the plurality of cell groups;
   determine an absolute DCIR threshold for the at least one of the plurality of cell groups based on the temperature; and
   provide an alert to the user in response to the DCIR value of the at least one of the plurality of cell groups exceeding the absolute DCIR threshold.

8. A system comprising:
   a battery pack comprising a plurality of cell groups operatively coupled to each other in series, wherein each of the plurality of cell groups comprises a plurality of battery cells operatively coupled to each other in parallel;
   a charger configured to charge the battery pack; and
   a computing apparatus comprising one or more processors and operatively coupled to the charger and the battery pack, the computing apparatus configured to:
   determine a relaxed voltage of each of a plurality of cell groups;
   cause the charger to provide a current pulse to the battery pack;
   determine a pulsed voltage of each of the plurality of cell groups during the current pulse; and
   determine a direct current internal resistance (DCIR) value of each of the plurality of cell groups based on the relaxed voltages, the pulsed voltages, and the current pulse;
   determine an average DCIR value based on the plurality of DCIR values;
   determine a relative DCIR threshold for at least one of the plurality of cell groups based on the average DCIR value; and
   provide an alert to a user in response to the DCIR value of the at least one of the plurality of cell groups exceeding the relative DCIR threshold.

9. The system as in claim 8, wherein the computing apparatus is further configured to:
   determine a plurality of average DCIR values based on the plurality of DCIR values; and
   determine a relative DCIR threshold for each of the plurality of cell groups based on the plurality of DCIR values.

10. The system as in claim 8, wherein each of the average DCIR values is an average of a subset of the DCIR values, wherein the subset of DCIR values includes at least one less DCIR value than a number of the plurality of DCIR values.

11. The system as in claim 8, wherein determining the relative DCIR threshold comprises adding a tolerance to the average DCIR value.

12. The system as in claim 11, wherein the tolerance is a percentage of the average DCIR value.

13. The system as in claim 11, wherein the tolerance is a predetermined number.

14. The system as in claim 8, wherein the computing apparatus is further configured to:
   determine a temperature of at least one of the plurality of cell groups;
   determine an absolute DCIR threshold for the at least one of the plurality of cell groups based on the temperature; and provide an alert to the user in response to the DCIR value of the at least one of the plurality of cell groups exceeding the absolute DCIR threshold.

15. The system as in claim 8, wherein the battery pack is disposed in a device.

16. A method comprising:
   determining a relaxed voltage of each of a plurality of cell groups of a battery pack, wherein each cell group comprises a plurality of battery cells;
   providing a current pulse to the battery pack using a charger;
   determining a pulsed voltage of each of the plurality of cell groups during the current pulse; and
   determining a direct current internal resistance (DCIR) value of each of the plurality of cell groups based on the relaxed voltages, the pulsed voltages, and the current pulse
   determining an average DCIR value based on the plurality of DCIR values;
   determining a relative DCIR threshold for at least one of the plurality of cell groups based on the average DCIR value; and
   providing an alert to a user in response to the DCIR value of one of the plurality of cell groups exceeding the relative DCIR threshold.

17. The method of claim 16, further comprising:
   determining a plurality of average DCIR values based on the plurality of DCIR values; and
   determining a relative DCIR threshold for each of the plurality of cell groups based on the plurality of DCIR values.

18. The method as in claim 16, wherein the average DCIR values is an average of a subset of the DCIR values, wherein the subset of DCIR values includes at least one less DCIR value than a number of the plurality of DCIR values.

19. The method as in claim 16, wherein determining the relative DCIR threshold comprises adding a tolerance to the average DCIR value.

20. The method as in claim 19, wherein the tolerance is a percentage of the average DCIR value.

21. The method as in claim 19, wherein the tolerance is a predetermined number.

22. The method as in claim 16, further comprising:
   determining a temperature of at least one of the plurality of cell groups;
   determining an absolute DCIR threshold for the at least one of the plurality of cell groups based on the temperature; and
   providing an alert to the user in response to the DCIR value of the at least one of the plurality of cell groups exceeding the absolute DCIR threshold.

* * * * *